United States Patent [19]

Schroeder et al.

[11] Patent Number: 4,513,355
[45] Date of Patent: Apr. 23, 1985

[54] METALLIZATION AND BONDING MEANS AND METHOD FOR VLSI PACKAGES

[75] Inventors: Jack A. Schroeder, Scottsdale; Ernel R. Winkler, Mesa, both of Ariz.

[73] Assignee: Motorola, Inc., Schaumburg, Ill.

[21] Appl. No.: 504,696

[22] Filed: Jun. 15, 1983

[51] Int. Cl.³ .................... H01L 23/02; H01L 23/12; H01L 39/02
[52] U.S. Cl. ................ 361/403; 174/52 FP; 339/17 CF; 357/74; 357/80
[58] Field of Search ........... 361/403, 404, 406, 409, 361/417, 421; 339/17 B, 17 CF; 29/827; 174/52 FP; 357/69, 70, 74, 80

[56] References Cited

U.S. PATENT DOCUMENTS

| 3,872,583 | 3/1975 | Beall et al. ................ 29/827 |
| 4,289,922 | 9/1981 | Devlin ...................... 174/52 FP |
| 4,296,456 | 10/1981 | Reid ........................ 361/421 X |
| 4,320,438 | 3/1982 | Ibrahim et al. ............. 361/406 X |
| 4,336,088 | 6/1982 | Hetherington et al. ...... 361/406 X |
| 4,338,621 | 7/1982 | Braun ....................... 357/80 X |
| 4,340,902 | 7/1982 | Honda et al. ............... 357/74 |
| 4,387,388 | 6/1983 | Zakhariya ................. 339/17 CF X |
| 4,437,141 | 3/1984 | Prokop ...................... 361/403 |
| 4,441,119 | 4/1984 | Link .......................... 357/80 X |
| 4,458,291 | 7/1984 | Yanagisawa et al. ........ 174/52 FP |

OTHER PUBLICATIONS

"2,800-gate, TTL-compatible part added to Macrocell Library" *Electronics* May 19, 1983, p. 166.
Kyocera Packaging Catalog A-122E from Kyota Ceramic Co., Ltd. pp. 1,7,9.

*Primary Examiner*—B. Dobeck
*Assistant Examiner*—Roger B. Carr
*Attorney, Agent, or Firm*—Robert M. Handy

[57] ABSTRACT

An improved VLSI device package and an improved method for contacting VLSI devices, in which the occurrences of wire bond shorts and lead voltage drops are substantially reduced, are obtained by providing multiple lead levels in the package, with the $N_2$ leads on the upper lead level grouped into $N_3$ bunches separated by $N_4$ spaces, where each of the $N_4$ spaces aligns with a bonding target on a corresponding one of the $N_1$ leads on the lower level leads of the package, and where $N_1 < N_2$, preferably $N_1 \leq 20$ to 30% of $N_1 + N_2$. Wire bonds from the device to the $N_1$ lower level leads align with the bonding targets, so that wire bonds from the device to the $N_2$ upper level leads lie in clear corridors between the bonds to the $N_1$ lower level leads. In this way wire bond crossovers and shorts are avoided. The $N_1$ lower level leads can be made wide and short and are used for the high current connections. Other leads can also be made wider, thus reducing inductive and resistive voltage drop in the package.

14 Claims, 11 Drawing Figures

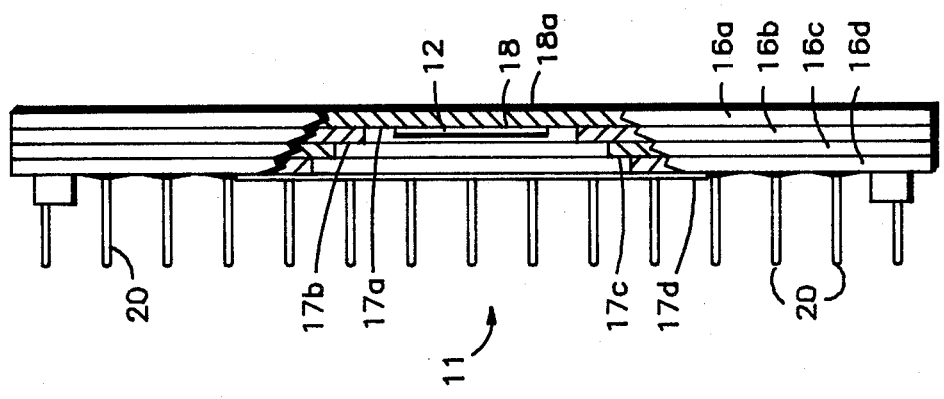
FIG. 1B
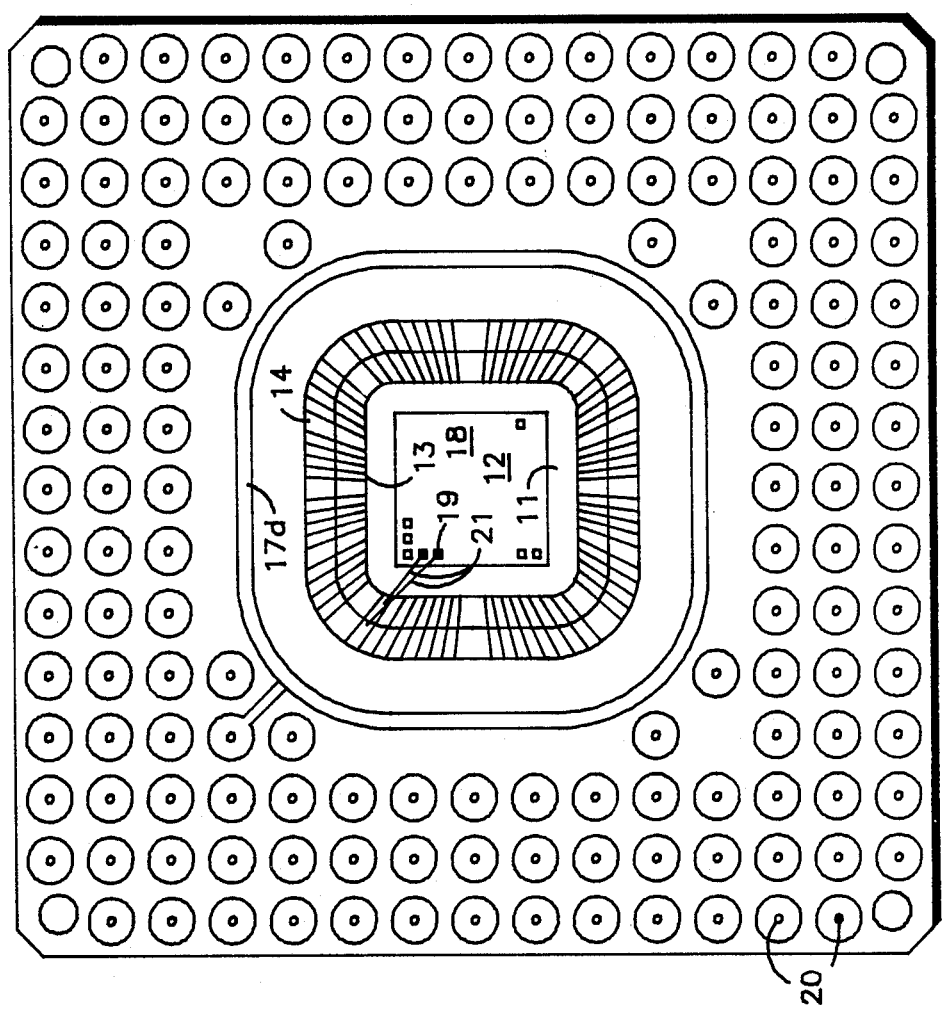
FIG. 1A — PRIOR ART —

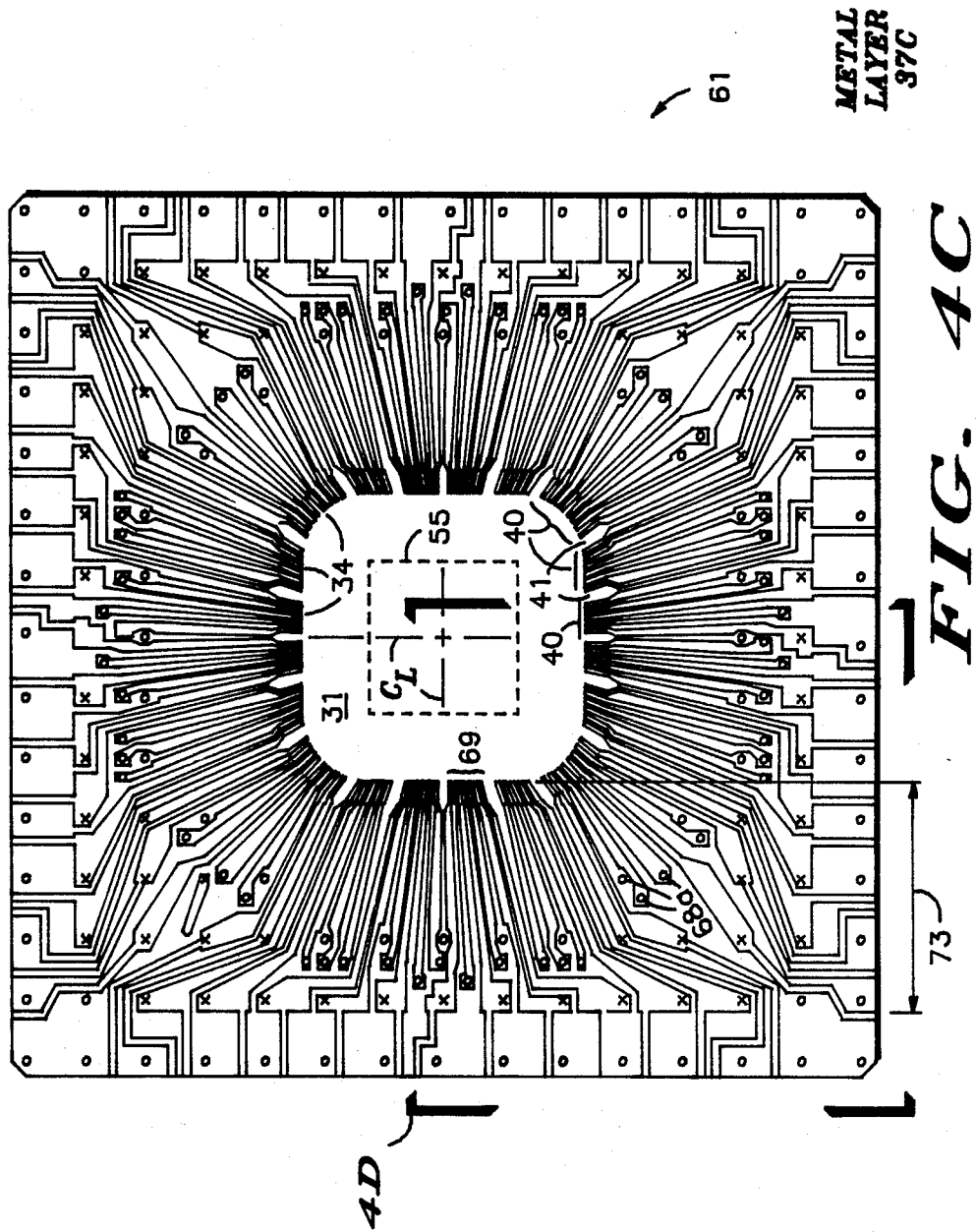

ing package leads and bonding areas so as to be compatible with obtaining high power dissipation.

It is a further object of the present invention to provide improved enclosures for electrical devices having multiple bonding pads.

It is a still further object of the present invention to provide an improved method for interconnecting enclosures and devices.

As used herein, the words "pad(s)" or "bonding pad(s)" refer to metallized regions on the device, e.g. a semiconductor chip, suitable for attachment of wire bonds or other connection means. The words "bonding area(s)" refer to metallized regions on the package or enclosure suitable for attachment of wire bonds or other connection means from the device. The words "wire(s)" or "bonding wire(s)" refer generally to the electrical connection means running between the bonding pads and the bonding areas. The connection means may have any useful cross-sectional shape, e.g. round, square, rectangular, etc., and be single or multiple. The words "bonding path(s)" refer to the location(s) of the bonding wires(s). The words "wire bond(s)" refer to the welded or soldered connection between a bonding wire or connection means, and a bonding pad or bonding area. The word "pin(s)" refers to the parts of the package where connection is made to the external socket or circuit. The words "lead(s)", "interconnect(s)", "interconnect lead(s)", "lead run(s)" and "interconnect lead run(s)" refer to metallized conductive path(s) within the package which generally electrically couple the bonding areas on the package to the package pins.

METALLIZATION AND BONDING MEANS AND METHOD FOR VLSI PACKAGES

BACKGROUND OF THE INVENTION

1. Field of the Invention

This invention relates in general to means and methods for making contact to electrical devices and, more particularly, to improved means and methods for making contact to electrical devices requiring a large number of external connections.

2. Description of the Prior Art

The complexity of electrical devices, particularly monolithic integrated circuits, is rapidly increasing. Large scale integrated (LSI) circuits having $10^3$ to $10^4$ devices per chip are commonplace. Very large scale integrated (VLSI) circuits having $10^4$ to $10^5$ devices per chip are now in volume production and others having $10^5$ to $10^6$ devices per chip are presently being designed and tested. Even more complex circuits are envisioned.

The required pin-count, that is, the quantity of external connections or leads which must be attached to each chip, is also increasing, although less rapidly than the device count. Nevertheless, pin-counts exceeding $10^2$ leads per device are now important. These high pin-counts require that a large number of wire bonds or other connection means between the bonding pads on the chip and the bonding areas on the package be placed in close proximity without shorts. At the same time, it is necessary to maintain low lead resistance and inductance, and frequently to remove substantial amounts of heat from the device. The combination of these requirements, that is, (1) large pin-counts, (2) closely spaced leads, (3) low lead resistance and inductance, and (4) large power dissipation, give rise to problems which have not been adequately solved in the prior art.

To reduce lead crowding, prior art packages have made use of multiple wiring levels each containing many leads, so that several rows of bonding areas on the package can be arranged one above and behind the other, somewhat like the keyboards of a large pipe organ, but wrapped around into a closed circle or rectangle. However, the prior art arrangement of package leads and bonding areas on several levels has aggravated the problem of wire bond cross-over and shorting. In addition, lead voltage drop within the package has not been minimized. The word "package", as used herein, refers to an enclosure for housing electronic components or devices and permitting convenient electrical coupling thereto. The words "wire bond" are intended to refer generally to means for electrically connecting bonding pads or bumps on an electrical device to associated bonding areas on the package used to house the device.

Accordingly, it is an object of the present invention to provide an improved means for arranging and configuring leads, bonding areas, and pads on device enclosures and devices to eliminate wire bond cross-over.

It is a further object of the present invention to provide an improved means for arranging and configuring package leads and bonding areas to reduce series lead resistance and inductance within the enclosure, in particular to reduce series resistance and inductance of power leads, that is, those leads which carry substantial currents.

It is an additional object of the present invention to provide an improved means for arranging and configur-

SUMMARY OF THE INVENTION

The above and other objects and advantages are achieved in accordance with the present invention wherein there is provided a device enclosure having two levels of interconnect leads, one above the other, radiating from a centrally located device cavity. The first (lower) level contains $N_1$ leads and the second (upper) level contains $N_2$ leads, where $N_1 < N_2$.

Each of the $N_1$ leads on the first level terminates near the device cavity in a large bonding area, some or all of which include a bonding target. The bonding target defines a preferred bonding path for a bonding wire or connection running between a bonding pad on the device and the bonding area on the first level lead.

The $N_2$ leads of the second level have their bonding areas near the device cavity bunched into $N_3$ groups with $N_4$ spaces between, where $N_4 = N_3$. These $N_4$ spaces are aligned along the $N_1$ preferred bonding paths defined by the bonding targets so that when wire bonds are made to the second level leads from bonding pads on the device or chip, no one of the bonding wires to the $N_2$ second level leads crosses over or lies above a bonding wire running from the chip to any of the $N_1$ lower level leads, thus avoiding bonding wire crossovers between the first and second level leads.

The series resistance, inductance, and voltage drop along the leads of the enclosure are reduced by using comparatively wide lead runs on the first lead level which are connected to the package pins nearest the device cavity. These lead runs occupy only a portion of the first lead level. These lead runs are adapted for use as the high current (power) connections to the device to minimize the series voltage drop. The series resistance, inductance, and voltage drop along other leads is also reduced by utilizing the space on the first lead level radially outside the power leads to provide wide low resistance interconnection between the outermost package pins and some of the leads on the second lead level. Since interconnects between the outer package pins and the interior package bonding areas are split between the first and second interconnect metallization levels, lead runs on both metallization levels located radially outside the power leads can be widened to provide lower series resistance and inductance. These features are important in reducing the static and transient voltage drop.

There is further provided an improved method for connecting multi-pad devices to multi-pin packages by providing an enclosure with multi-level leads and bonding areas arranged as described above, providing a device with bonding pads grouped to correspond to the package leads, bonding the device into the package oriented so that the lead groupings and pad groupings substantially correspond, bonding the first level leads to corresponding device pads along the preferred bonding paths established by the bonding targets, bonding the second level leads to other bonding pads where the corresponding leads and pads are rotationally displaced from the preferred bonding path by approximately the same angle.

BRIEF DESCRIPTION OF THE DRAWINGS

FIG. 1A shows a pin-side up plan view of a typical "bed-of-nails" VLSI package of the prior art.

FIG. 1B shows a simplified side and partial cut-away view of the package of FIG. 1A.

FIG. 4C shows a plan view of the second interconnect metallization layer of the package of FIGS. 2A-B, according to the present invention.

DETAILED DESCRIPTION OF THE DRAWINGS

Figure 2B:
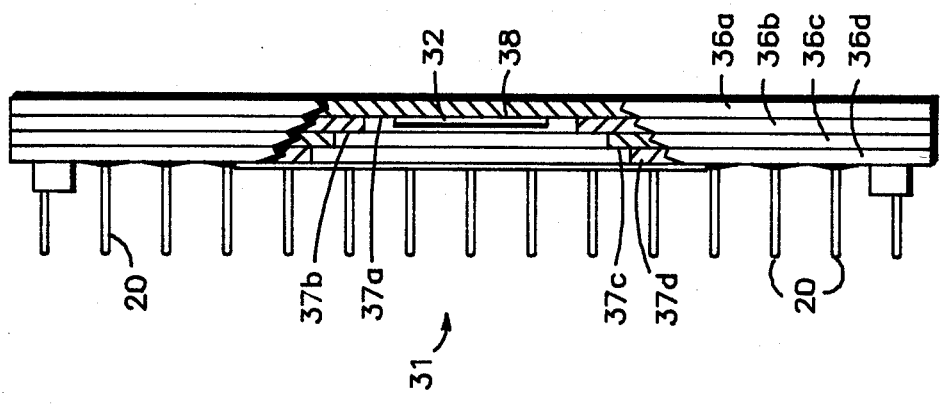
FIG. 2B shows a simplified side and partial cut-away view of the package of FIG. 2A.

FIG. 1A shows a plan view, pin side up, of bed-of-nails VLSI package 10 according to the prior art. FIG. 1B shows a simplified side and partial cut-away view of the same package. Package 10 is constructed of multiple sheets or layers 16a-d of insulating material, usually a ceramic. Sheets 16a-d of insulating material are partially coated with patterned metallization layers 17a-d. Portions of metallization layers 17a-c are sandwiched between sheets 16a-d. Metallization layer 17d generally serves as a seal ring for attachment of the package lid (not shown). End portions 13 and 14 of patterned interconnect metallization layers 17b and 17c, respectively, are exposed in central cavity 11 of package 10 to provide bonding areas for attachment of bonding wires 21 which connect to centrally mounted semiconductor chip or die 12. Semiconductor die 12 is mounted on bottom metallization layer 17a in die bond region 18. Metallization layers 17a-c provide the lead runs internal to the package which connect package pins 20 to die bond region 18 and to bonding areas (end portions) 13 and 14 respectively. Bonding areas 13 and 14 are the end portions of the leads formed in metallization layers 17b-c. Pins 20 are used to make external connection to the finished device.

Metallization layer 17a includes die bond region 18 typically used for mounting die 12. Metallization layer 17b provides a first interconnect layer of leads which connect a first portion of package pins 20 to bonding areas (end portions) 13. Bonding areas 13 are exposed in central cavity 11. First level bonding areas 13 encircle and lie closest to die 12 (see FIG. 1A).

Metallization layer 17c provides a second interconnect layer of leads which connect a second portion of package pins 20 to bonding areas (end portions) 14 which are also exposed in central cavity 11. Second level bonding areas 14 encircle first level bonding areas 13. The use of two levels of metallization 17b and 17c, and two levels of bonding areas 13 and 14 is important when large numbers of leads are required, since with only one wiring level, the leads and bonding areas would be so crowded as to be impractical. Package 10, as illustrated in FIGS. 1A-B, has one hundred and forty-nine pins; one pin connected to seal ring layer 17d, four pins connected to base metallization layer 17a, and one hundred and forty-four pins connected to the lead runs in first and second interconnect metallization layers 17b-c. It will be noted that there are seventy-two lead runs in each of the two interconnect layers 17b-c. These lead runs terminate in seventy-two bonding areas 13 in layer 17b and seventy-two bonding areas 14 in layer 17c, respectively. Each of the seventy-two lead runs is formed from a single level of metallization and couples a particular package pin to one of the end portions 13 or 14 used for a bonding area. This permits a simple design for the metallization patterns, but often results in narrow lead runs with undesirable voltage drops within the package, particularly along those leads which must carry substantial currents. By attaching a heat sink to face 18a opposite die bond region 18, large amounts of power can be dissipated.

A significant problem with the prior art packages is that the total number of lead runs is divided approximately evenly between the two interconnection levels, as is illustrated in FIGS. 1A-B. This results in bonding areas 13 and 14 being arranged in a stepped fashion, one above the other, like the keys of a two-manual pipe organ. As a consequence when bonding wires 21 are connected from bonding pads 19 of chip 12 to bonding areas 13 and 14, the bonding wires going to second level bonding areas 14 often have to pass close to or over bonding wires going to first level bonding areas 13. This substantially increases the possibility that bonding wires 21 will short together. The shorting may occur during assembly if the height of the bonding wire loop is not carefully controlled, or during later use when the finished device may be subjected to large acceleration forces which can cause the bonding wire to flex.

It has been discovered that if the interconnection leads, that is, the lead runs on the package, are substantially unequally divided between the first and second metallization levels, and further are grouped in a particular way, that the geometric position of the bonding wires is such that the possibility of shorting is much reduced. This comes about because the second level bonding wires can be located in clear corridors which are free of first level bonding wire. In order to facilitate locating the bonding wire along the proper clear corridors, it is desirable to shape the wire bond areas on the leads of the first interconnection level so that they include bonding targets. The wire bond operator or the automatic pattern recognition equipment guiding the wire bonding machine uses some or all of the bonding targets as aiming points for aligning the bonding wire in placing the first and second levels of wire bonds. Additionally, the invented arrangement of lead runs on the package makes it possible to reduce the static voltage drop and dynamic voltage transients along certain critical lead paths in the package. Reduction of static and dynamic voltage drop is an important feature of the present invention.

Figure 2A:
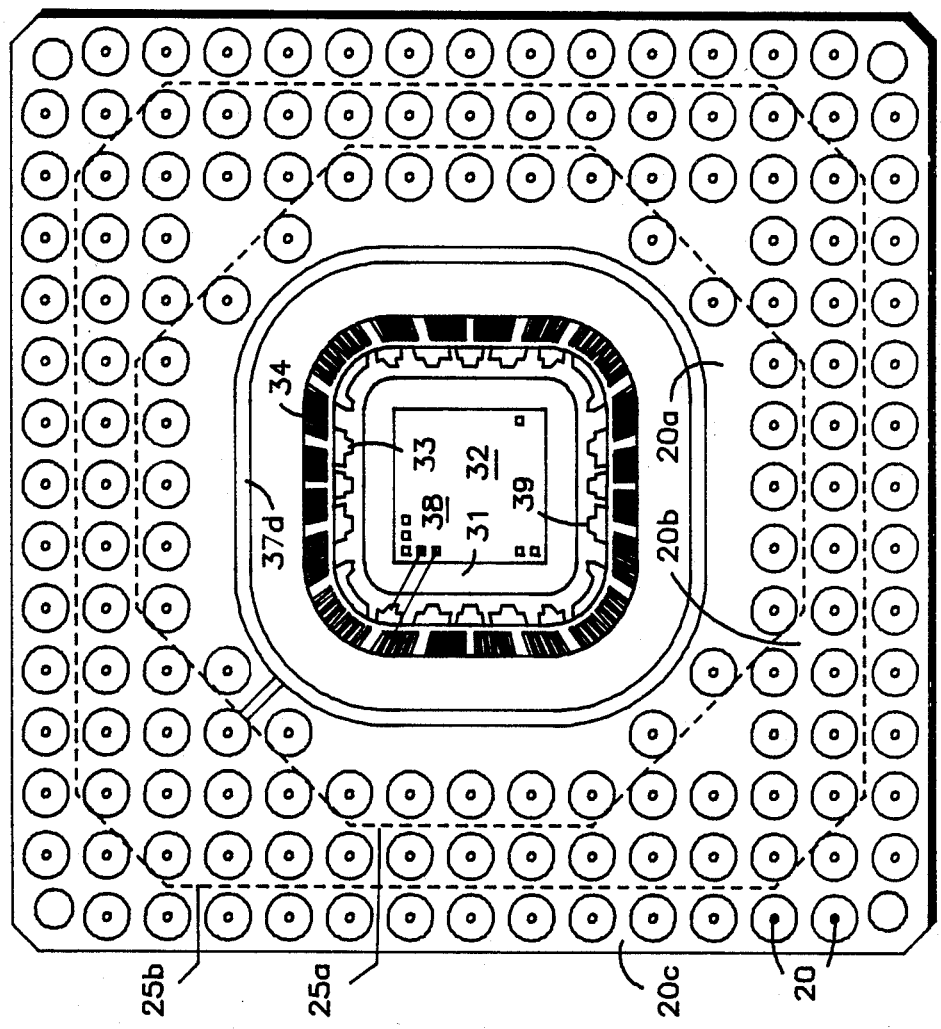
FIG. 2A shows a pin-side up plan view of a "bed-of-nails" VLSI package of according to the present invention.
Figure 3A:
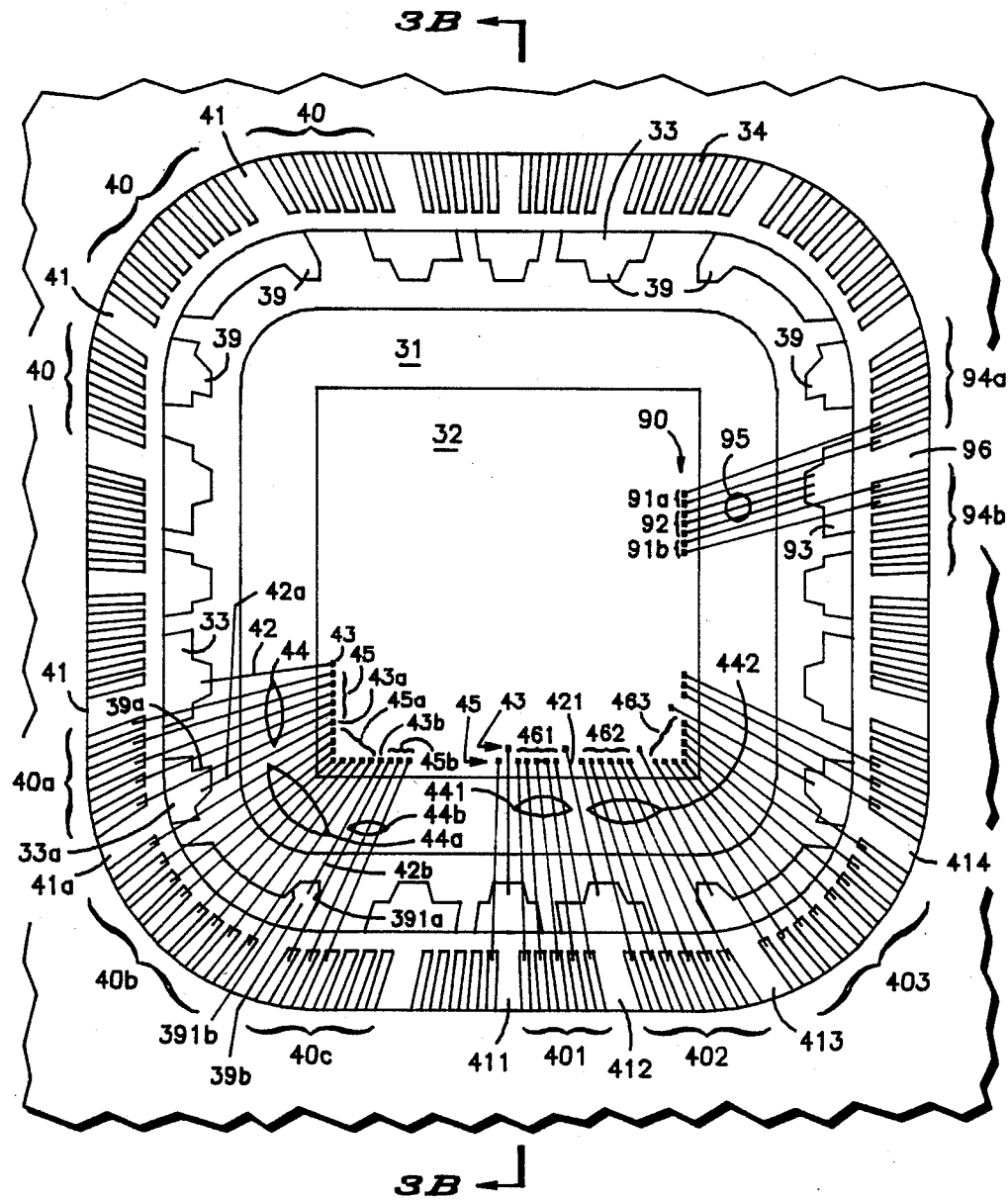
FIG. 3A shows a plan view of an enlargement of the central portion of the package of FIG. 2A.
Figure 3B:
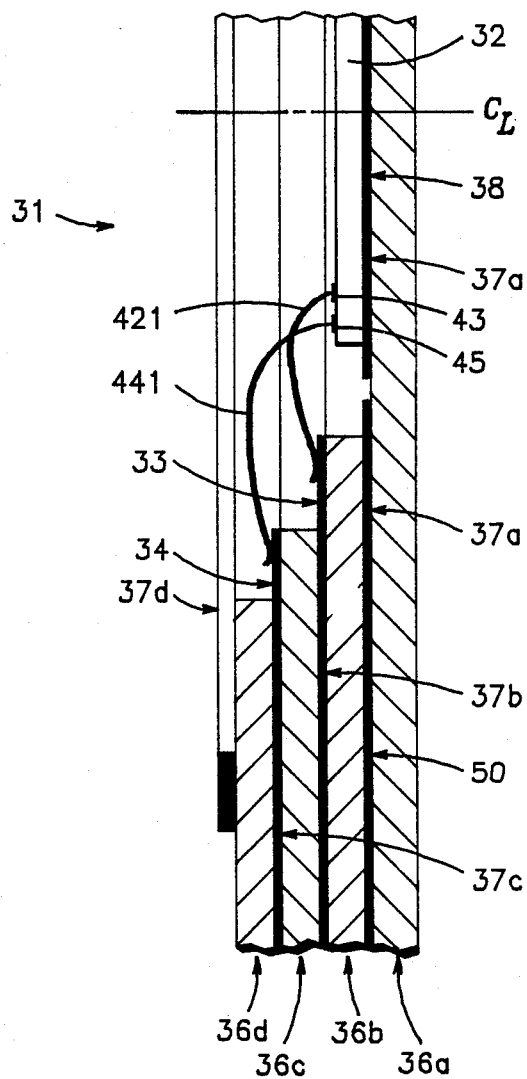
FIG. 3B shows a partial cross section of the package portion of FIG. 3A.

FIG. 2A shows a pin-side up plan view of bed-of-nails VLSI package 30 according to the present invention, and FIG. 2B shows a simplified side and partial cut away view. Package 30 has central cavity 31 adapted to receive semiconductor die or chip 32 on die bond area 38. FIG. 3A shows a plan view of an enlargment of the central portion of the package of FIG. 2A in which die 32 can be more clearly seen, and FIG. 3B shows a partial cross-section of FIG. 3A. While the present invention is described as being particularly adapted for housing semiconductor VLSI die or chips, those of skill in the art will recognize that the invention is useful with many other types of electronic devices as well. Josephson devices and bubble memories are two non-limiting examples. As used herein the words "die" and "chip" whether prefixed by "semiconductor" or not, are intended to include all types of electronic devices having multiple, i.e. ten or more, leads.

Package 30 is constructed of multiple sheets or layers 36a-d of insulating material and multiple layers 37a-d of metallization, in much the same manner as for prior art package 10. However, the shape and layout of the lead runs interconnecting pins 20 and bonding areas 33-34, respectively, of metallization layers 37b-c of package 30, are different than the shape and layout of the lead runs interconnecting pins 20 and corresponding bonding areas 13-14 of layers 17b-c of prior art package 10. Examples of the layout of interconnect metallization layers 37a-c, according to a preferred embodiment of the present invention, are shown in FIGS. 4-D and will be discussed in more detail later.

As shown in FIGS. 2A-B, 3A-B, and 4A-C, the number of lead runs on interconnect metallization layers 37b-c has been unequally divided so that first interconnect metallization layer or level 37b has substantially fewer lead runs than second interconnect metallization layer or level 37c. In this example first interconnect metallization layer 37b has twenty lead runs terminating in twenty bonding areas (end regions) 33, and second interconnect metallization layer 37c has one hundred and twenty lead runs terminating in a corresponding number of bonding areas (end regions) 34, for a sub-total of one hundred and forty lead runs on interconnect metallization layers 37b-c. The sub-total of lead runs is not critical, for example, the sub-total of lead runs could equally well have been one hundred and forty-four as in the prior art package illustrated in FIGS. 1A-B. It is desirable however, that thirty percent, preferably twenty percent, or less of the the sub-total number of lead runs be placed on the first interconnect metallization layer, i.e. layer 37b, and the balance on the second interconnect metallization layer, i.e. layer 37c. In the embodiment illustrated in FIGS. 2A-B, 3A-B, and 4A-D, one pin is coupled to seal ring metallization layer 37d, and eight pins are coupled to base layer metallization 37a, for a grand total of one hundred and forty-nine pins, the same total number as in the prior art package of FIGS. 1A-B. The details are more clearly seen by reference to FIGS. 3A-B and 4A-D.

Bonding areas 33 of first interconnect metallization layer 37b are comparatively wide so as to have minimum resistance and inductance, and are used for the power leads to the chip so as to minimize the voltage drop and voltage transients in those lead runs which must carry the heaviest currents. Reduction of voltage transients caused the rapid switching of the electrical device is particularly important in high speed VLSI applications.

Some or all of bonding areas 33 of layer 37b have associated therewith a bond location indicator or bonding target 39, that is, a geometric feature which serves as an aiming point during the bonding operation (see FIG. 3A). The bonding target may be a geometric feature which is a part of the bonding area itself, or it may be a separate marker placed on the supporting insulator. It is convenient to make bonding targets 39 a part of bonding areas 33, as illustrated in FIGS. 2A-B, 3A-B, and 4B. Bonding targets readily identified by automatic equipment may be provided on some or all of bonding areas 33, as for example at 39a in FIG. 4B.

Bonding areas 34 of layer 37c are arranged in groups 40 separated by spaces 41. The number of groups 40 and spaces 41 of layer 37c are equal. They should also be at least equal to the number of bonding areas on layer 37b. Bonding targets 39 on layer 37b and spaces 41 on layer 37c are arranged, respectively, so that bonding wires 42 from bonding pads 43 on die 32, are directed toward targets 39 on bonding areas 33 of first level metallization layer 37b, so as to line up with spaces 41 between groups 40 of bonding areas 34 on second level metallization layer 37c. This creates clear corridors or bonding paths for bonding wires 44 leading from remaining bonding pads 45 on die 32 to second level bonding areas 34. For example, (see FIG. 3A) bonding wire 42a running from bonding pad 43a on die 32 to first level package bonding area 33a is arranged, using bonding target 39a, to line up with space 41a between groups 40a-b of second level bonding areas 34. It is also desirable to shape bonding targets 39 so that the clear corridors or paths for bonding wires 44 can be readily seen by the wire bond operator, wire bond inspector, and/or the pattern recognition equipment on an automatic wire bonder. This is illustrated in FIG. 3A where bonding target 39b, whose bonding area is connected by bonding wire 42b to bonding pad 43b, has sides 391a-b which align with and lie approximately parallel to the clear corridors containing bonding wires 44a-b leading from die bonding pads 45a-b to groups 40b-c of package bonding areas 34.

Die 32 is desirably located centrally in cavity 31, but this is not critical. It is more important that bonding pads 43 and 45 on die 32, and bonding areas 33 and 34 on package 30, be arranged in the correct sequence and number so that bonding pads 43 intended to be coupled by bonding wires to bonding areas 33 on first level interconnect metallization layer 37b, are separated by a number of bonding pads 45 on die 32 which is not more than the number of bonding areas 34 in group 40 lying between adjacent spaces 41. For example, FIG. 3A shows groups 401, 402, and 403 of bonding areas 34 on package 30. Groups 401, 402, and 403 have five, six, and eight bonding areas 34, respectively, positioned between spaces 411, 412, 413, and 414. It is desirable that facing groups 461, 462, and 463 of bonding pads 45 on die 32 have the same or fewer bonding pads per group, that is, not more than five, six, and eight respectively. If such a sequence is utilized, the path of adjacent bonding wires will be rotationally or angularly displaced, as illustrated by wire bonds 421 and 441-2, so that they do not intersect and create a potential for shorts. It is also desirable that bonding areas 33 and corresponding pads 43 be distributed around the periphery of cavity 31 and die 32, respectively, by about the same angular displacement with respect to a common center so that bonding wires 42 and 44 are approximately radial with respect to the die and package cavity.

Figure 5:
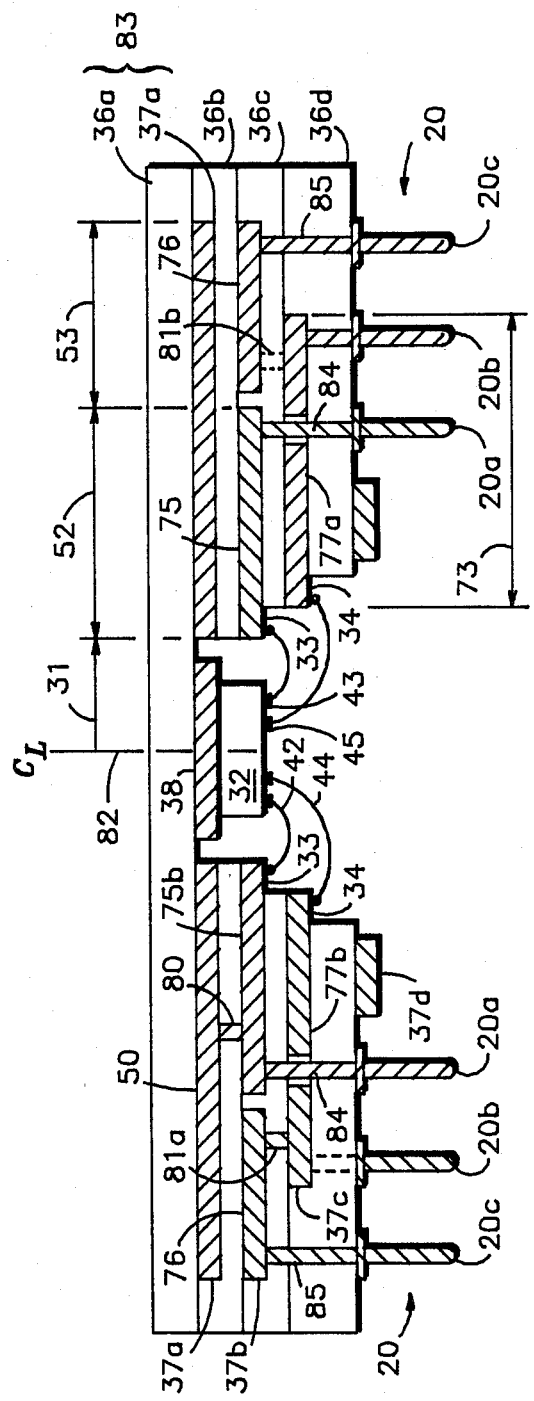
FIG. 5 is a schematic cross-sectional view of the package of the present invention illustrating the interconnection of the package pins and the wire bonding areas of the package by the interconnect metallization layers and vias.

FIG. 3A illustrates two arrangements of bonding pads 43 and 45: first, at the left of FIG. 3A, bonding pads 43 and 45 are arranged in a single file or row near the periphery of die 32, and second, at the right of FIG. 3A, bonding pads 45 are arranged in a first file or row near the periphery of die 32, and bonding pads 43 are arranged slightly in-board of pads 45 in a second row or file. It is the second arrangement which is shown in FIG. 3B. Conversely, bonding pads 45 can be arranged in-board of pads 43. The latter arrangement of bonding pads 43, 45 and bonding wires 42, 44 is illustrated in FIG. 5. However, this is usually less desirable since more pads can be accommodated if the row or file having the largest number of pads is placed nearest to the periphery of the die. More than two rows or files of bonding pads can also be used. It is desirable that the chip bonding pads be arranged so that wire bonds to one pad do not cross over another pad.

FIG. 3A also illustrates a further useful variation wherein die 32 has bonding pads 90 arranged so that bonding area 93 has three bonding wires 95 bonded thereto from pads 92 on die 32. Wires 95 are electrically in parallel. Space 96 and bonding areas 93 have sufficient width to accommodate multiple bonding wires, e.g. three in this example, without interfering with the bonds from adjacent pads 91a-b to bonding areas 94a-b. This arrangement is useful to reduce the series resistance and inductance presented by the bonding wires which connect to the high current lead runs on metallization layer 37b.

Figure 4A:
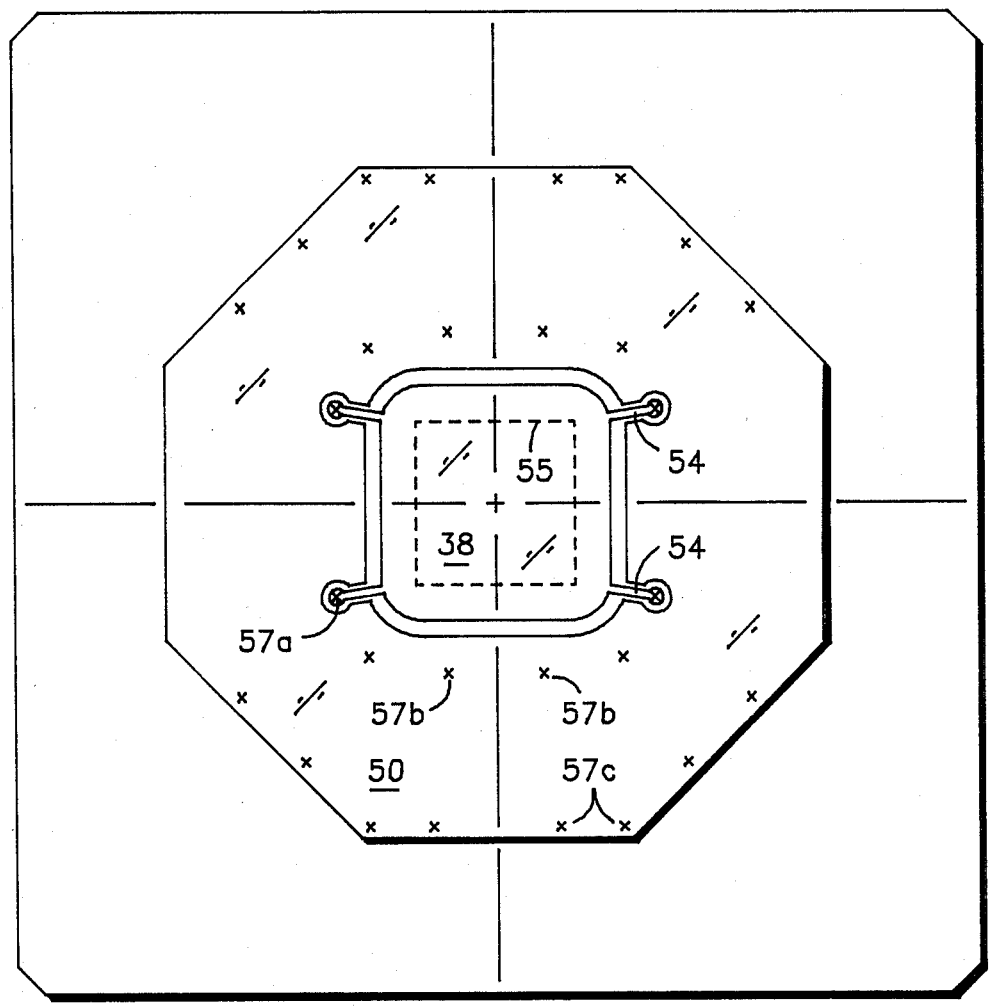
FIG. 4A shows a plan view of the pattern of the base layer metallization of the package of FIGS. 2A-B, according to the present invention.

FIG. 4A shows a preferred embodiment of patterns 56 of base layer metallization layer 37a. The "x"'s (e.g. at 57a) on leads 54 running outwardly from die bond region 38 indicate, by way of example, connection by means of vias to metal layer 37b of FIG. 4B. Remaining metallization area 50 contains "x"s, at at 57b-c, which indicate connection by means of vias to other portions of metal layer 37b. Area 50 usually serves as a local ground plane. Dashed outline 55 shows the approximate location of die 32 on die bond region 38.

Figure 4B:
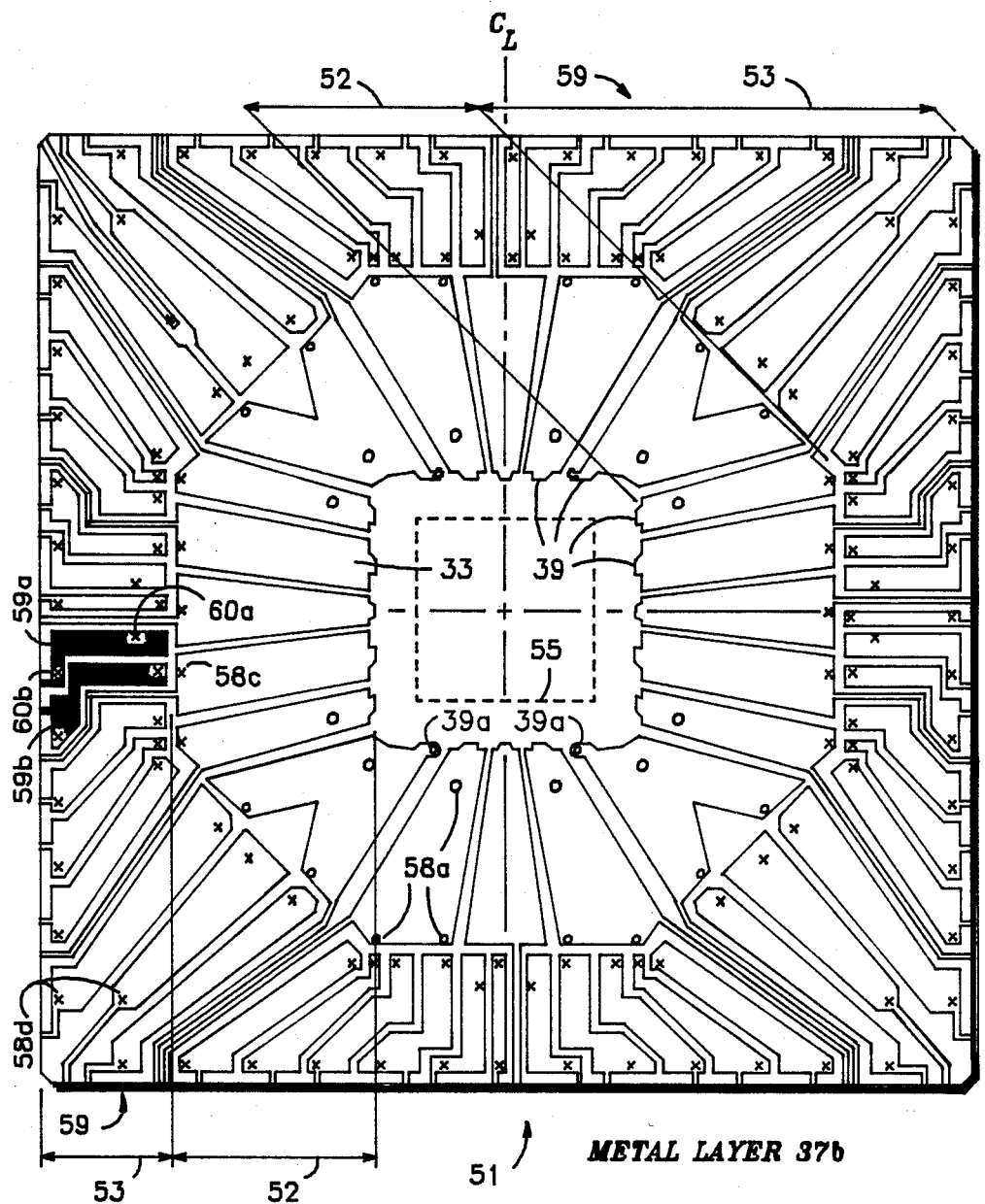
FIG. 4B shows a plan view of the first interconnect metallization layer of the package of FIGS. 2A-B, according to the present invention.

FIG. 4B shows a preferred embodiment of layout or pattern 51 of lead runs on interconnect metallization layer 37b. Each small circle, e.g. 58a, denotes a contact via to base metallization layer 37a of FIG. 4A. Small "x"'s, e.g. 58c-d, denote vias connecting various regions of layer 37b to metallization layer 37c (see FIG. 4C). It will be noted that metallization pattern 51 of layer 37b can be divided into approximately two portions, central portion 52 which connects centrally located group or rank 20a (see FIG. 2A) of pins 20 to bonding areas 33, and peripheral portion 53 which connects peripherally located group or rand 20c of pins 20, by means of peripheral lead runs 59 and vias, to portions of metallization layer 37c, shown in FIGS. 4C-D. Two members 59a-b of peripheral lead runs 59 have been highlighted by way of example.

This arrangement of central and peripheral leads or lead runs is a significant advantage, since it allows the series resistance and inductance of the otherwise smaller and longer lead runs on the second interconnect level (i.e. the level occupied by layer 37c) to be reduced. The area occupied by peripheral portion 53 is not needed for interconnecting group 20a pins to bonding areas 33 of layer 37b. These interconnections to areas 33 are comparatively few in number and have short path lengths. Hence it is advantageous to use the balance of layer 37b, i.e. peripheral region 53, to provide wider and lower resistance interconnect metallization lead runs 59 for some of the signals which originate from bonding areas 34 on layer 37c.

Figure 4D:
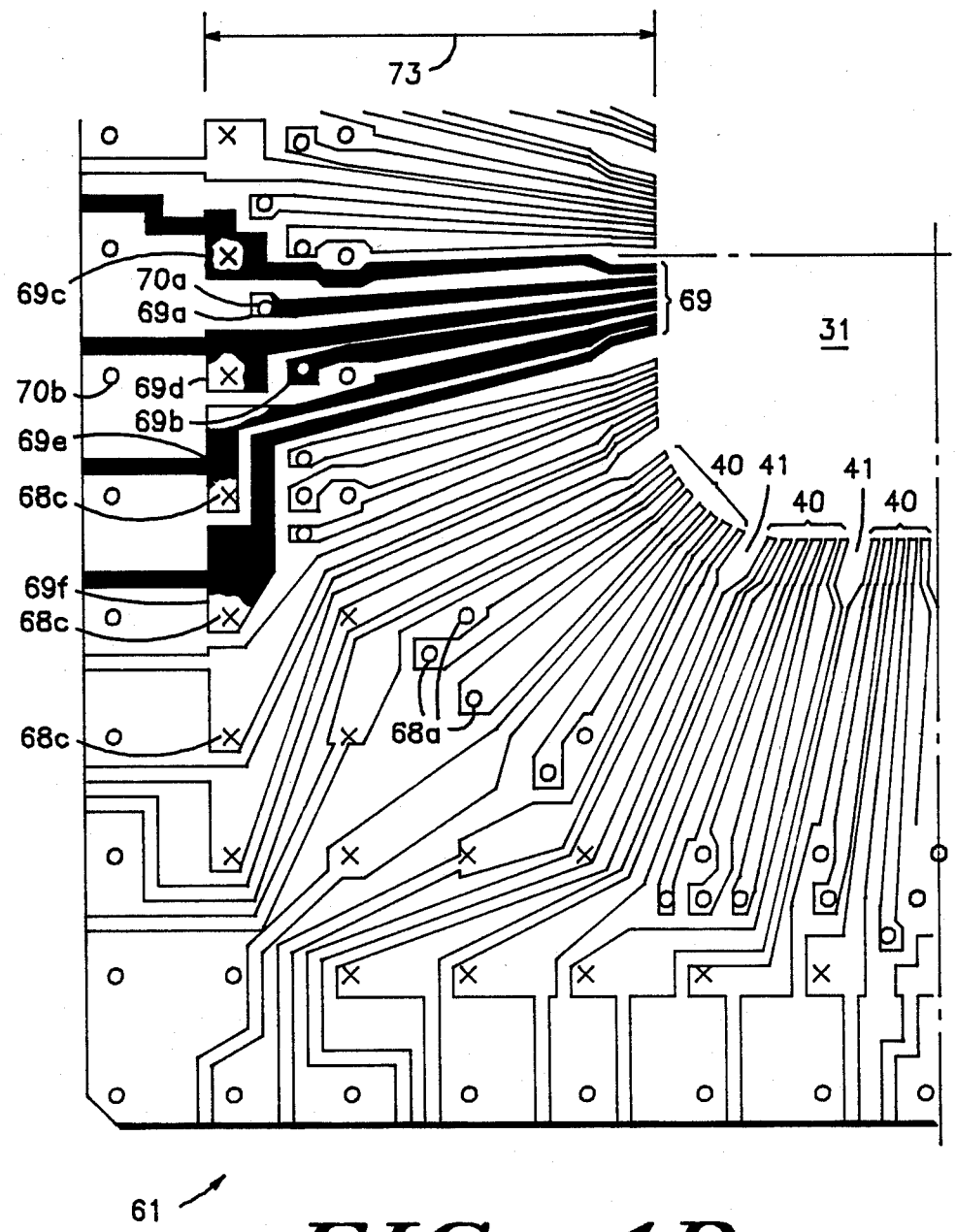
FIG. 4D shows an enlargement of a portion of FIG. 4C to provide greater detail.

FIG. 4C shows a plan view of pattern 61 of second interconnect metallization layer 37c. FIG. 4D is an enlargement of the lower left quarter of FIG. 4C to show greater detail. One group of lead runs has been high-lighted in FIG. 4D by way of example. Groups 40 and spaces 41 in lead pattern 61 in the vicinity of central cavity 31 are indicated. Small circles, as for example at 68a, indicate vias to layer 37b of FIG. 4B, and "x"'s, as for example at 68c, denote contact to various of pins 20. By comparing FIGS. 4C-D and FIG. 4B it will be noted that some of lead runs 69, (e.g. lead 69a), extend to vias (e.g. 70a) by means of which they connect to lead runs 59, (e.g. lead 59a), of peripheral portion 53 of layer 37b. It will be noted that vias 70a, 70b of FIGS. 4C-D corresponds to vias 60a, 60b respectively of FIG. 4B, that is, they are the same vias appearing on two different layers. Vias 60a, 70a and 60b, 70b couple lead 69a of layer 37c through interconnect lead run 59a to an external connection pin located coincident with via 60b, 70b. This arrangement is further illustrated at the left of FIG. 5, with respect to pins 20c, and is discussed further in connection with FIG. 5.

Others of leads 69, e.g. 69c-f, run directly to others of pins 20, in particular, to members of group or rank 20b of pins 20 (see FIGS. 2A and 5). Pins 20b are those of pins 20 closest to bonding areas 34 and not already used for connection to bonding areas 33 of layer 37b. Pins 20b lie out-board of pins 20a. Pins 20c lie out-board of pins 20b and are furthest from central cavity 31. Utilizing peripheral portion 53 of metallization layer 37b to provide additional space for those lead runs originating on layer 37c, which have the farthest to go to reach pins 20c, allows the width of the metal runs on each metallization layer to be increased and the series resistance decreased. This arrangement of bonding areas, leads, and pins is discussed further in connection with FIG. 5.

FIG. 5 is a schematic cross-sectional view of the arrangement of insulating layers 36a-d and metallization layers 37a-d, of the package of FIGS. 2A-B, 3A-B, and 4A-D, showing additional detail regarding the vias interconnecting metallization layers 37a-c and external connection pins 20. Metallization layers 37a-d have been cross-hatched and insulating layers 36a-d left plain so that the vias running between various metallization layers 37a–b and to pins 20 may be easily seen. The thickness of metallization layers 37a–d has been exaggerated.

Insulating base layer 36a has thereon base metallization layer 37a comprising die bond region 38 and ground plane region 50. Insulating layer 36a with metallization layer 37a forms substrate 83 on which further insulating layers 36b–d and metallization layers 37b–d are disposed. Insulating layer 36b separates ground plane region 50 from first interconnect metallization layer 37b, except where a particular lead, e.g. 75b, may be desired to be connected to ground plane area 50 by means of conductive via 80. Insulating layer 36c separates first interconnect metallization layer 37b from second interconnect metallization layer 37c, except where the respective layers may be desired to be interconnected by means of conductive vias, as at 81a–b. Insulating layer 36d separates second interconnect metallization layer 37c from seal ring metallization layer 37d. A via (not shown) is sometimes provided to tie seal ring metallization layer 37d to one or more of the other metallization layers and/or a pin. This permits seal ring layer 37d and the package lid (not shown) attached thereto to be grounded.

The arrangement of contact pins 20 is illustrated as being approximately mechanically symmetrical around center lines 82 of package 30. This is convenient but not essential. The electrical interconnect arrangements among pins 20 and bonding areas or regions 33, 34, and 38 need not be symmetrical. The schematic cross-section of FIG. 5 is intended to illustrate the different types of arrangements of lead runs and vias within package 30.

Referring to FIG. 5, package 30 or substrate 83 is divided into three regions: first region or central cavity 31, for receiving electrical die 32; second region 52, for receiving first array of contact lead runs 75; and third region 53, for receiving first array of interconnect lead runs 76. Insulating layer 36c, partially covering lead runs 75 and 76 of layer 37b, has thereon second array of contact lead runs 77a–b located in region 73 and formed by metallization layer 37c. As noted in connection with the discussion of FIGS. 2A–B and 4A–D, contact pins 20 are disposed in approximately three concentric ranks or groups of pins 20a–c. First rank or group of pins 20a is located nearest central cavity 31 and die 32, and is electrically coupled to bonding areas 33 by means of lead runs 75 of metallization layer 37b. Pins 20a are connected to lead runs 75 by means of vias 84. Second rank or group of pins 20b is located laterally outside first rank pins 20a, and connects to first portion 77a of second array of contact lead runs 77a–b. Second portion 77b of lead runs 77a–b is coupled by means of vias, as for example by means of vias 81a–b, to first array of interconnect lead runs 76, which are in turn coupled to third rank or group of pins 20c by means of vias 85. Third rank or group of pins 20c is the outermost group of pins, that is, furthest away from the center of the package. Pins 20b–c are coupled to bonding areas 34 by means of lead runs 76 and 77a–b. This multiple level interconnect scheme allows the width of the lead runs on layers 37b and 37c to be increased and their series resistance and inductance decreased. This avoids the excess resistance and inductance problems which might otherwise result from having placed the majority of package bonding areas, e.g. areas 34, on one interconnect metallization layer, i.e. layer 37c, and the consequent narrowing of the many lead runs in order to fit them on a single level.

It will be appreciated by those of skill in the art that the features described above, result in a means and method for providing multiple pin packages for electronic circuits and devices, wherein the probability of wire bond shorts is reduced and the series resistance and inductance of those leads required to carry the heaviest currents is also reduced, so that device performance is improved. It will be further appreciated that the arrangement of bonding areas, lead runs, interconnect runs, and vias does not interfere with locating die 32 in cavity 31 wherein maximum opportunity exists for heat extraction through layers 36a and 37a. This aids in achieving high power dissipation.

It will also be appreciated that, although described in terms of a "bed of nails" type package, the invented means and method for grouping, arranging and shaping the leads or lead runs to reduce bond wire crossovers are applicable to other types of packages, particularly those types employing multilevel leads. Accordingly, it is intended to encompass all such variation within the present invention.

I claim:

1. A device enclosure for containing a device with bonding pads, comprising:

$N_1$ lead runs arrayed on a first level, wherein said $N_1$ lead runs extend toward a central cavity adapted to contain a device, wherein each of said $N_1$ lead runs terminates in a first bonding area adapted to receive a first connection from a corresponding one of said bonding pads on said device, wherein at least one of said first bonding areas has associated therewith a first bond location indicator having a predetermined position defining a preferred bonding path from said one of said bonding pads to said corresponding bonding area; and $N_2$ lead runs arrayed on a second level, different from said first level, wherein said $N_2$ lead runs extend toward said central cavity, wherein $N_2 > N_1$, wherein each of said $N_2$ lead runs terminates in a second bonding area adapted to receive a second connection from a corresponding other of said bonding pads on said device, wherein said second bonding areas are arranged in groups circumferentially positioned around said central cavity, wherein said groups are separated by $N_3$ spaces, wherein $N_3$ at least equals $N_1$, and wherein each of said $N_3$ spaces is aligned so as to be located substantially on an extension of a line drawn along said preferred bonding path.

2. The device enclosure of claim 1 further comprising an electrical device coupled to a first portion of said $N_1$ lead runs and a second portion of said $N_2$ lead runs.

3. The device enclosure of claim 1 wherein $N_1$ is not greater than 30% of $N_1 + N_2$.

4. The device enclosure of claim 3 wherein $N_1$ is not greater than 20% of $N_1 + N_2$.

5. A multi-level lead arrangement for use in contacting an electrical device having multiple bonding pads, comprising:

a first level of a first predetermined number of first leads, wherein said first leads extend toward a central cavity adapted to contain said device, wherein each of said first leads terminates in a first bonding area adapted to receive a first connection from a one of said bonding pads on said device, wherein at least one of said first bonding areas has associated therewith a first bonding target having a predetermined position defining a preferred bonding path from said one of said bonding pads to said first bonding area; and a second level, different from said first level, of a second predetermined number of second leads, wherein said second leads extend toward said central cavity, wherein each of said second leads terminates in a second bonding area adapted to receive a second connection from at least one other of said bonding pads on said device, wherein said second bonding areas are arranged in groups circumferentially located around said central cavity, wherein said groups are separated by spaces, wherein said spaces are at least equal in number to said predetermined number of said first leads, and wherein each of said spaces is aligned so as to be located substantially on an extension of a line drawn along said preferred bonding path.

6. An electrical device enclosure (30) having a large number of contact pins (20), comprising:

a substrate (83) having a first region (31) for receiving an electrical device (32), a second region (52) for receiving a first array of contact lead runs (75) and, a third region (53) for receiving a first array of interconnect lead runs (76);

a first insulating layer (36b) overlying a portion of said substrate (83) exterior to said first region (31);

on said first insulating layer (36b), said first array of contact lead runs (75) overlying said second region (52) of said substrate (83), and first array of interconnect lead runs (76) overlying said third region (53) of said substrate (83);

a second insulating layer (36c) overlying a portion of said first insulating layer (36b), and having a first region (73) for receiving a second array of contact lead runs (77a–b);

said second array of contact lead runs (77a–b) overlying said first region (73) of said second insulating layer (36c);

said contact pins (20) disposed so that a first portion (20a) of said contact pins are electrically coupled to said first array of contact lead runs (75), a second portion (20b) of said contact pins are electrically coupled to a first portion (77a) of said second array of contact lead runs (77a–b), and a third portion (20c) of said contact pins are electrically coupled to said first array of interconnect lead runs (76);

electrical interconnection means (81a–b) for coupling a second portion (77b) of said second array of contact lead runs (77a–b) to said first array of interconnect lead runs (76);

wherein said first array of contact lead runs has thereon a first number of first wire bond contact areas and said second array of contact lead runs has thereon a second number of second wire bond contact areas; and wherein said first array of contact lead runs (75) and said first array of interconnect lead runs (76) comprise lead runs wider than lead runs in said second array of contact lead runs (77a–b).

7. The device enclosure (30) of claim 6 wherein said first number of first wire bond areas is not more than 30% of the sum of said first and second numbers of first and second wire bond areas.

8. The device enclosure (30) of claim 6 wherein said lead runs of said first array of contact lead runs (75) have a first minimum width and said lead runs of said first array of interconnect lead runs (76) have a second minimum width and said lead runs of said second array of contact lead runs (77a–b) have a third minimum width, and wherein said third minimum width is less than said first and second minimum widths, and wherein said first, second, and third widths are measured in the plane of said insulating layer on which said lead runs rest and substantially perpendicular to the direction of current flow in said lead runs.

9. The device enclosure (30) of claim 7 wherein said first array of contact lead runs (75) have inner ends (33) adjacent said first region (31) of said substrate (83) and said second array of contact lead runs (77a–b) have inner ends (34) adjacent said inner ends (33) of said first array of contact lead runs (75), and wherein each of said inner ends (33) of said first array of contact lead runs (75) comprises a bonding target (39) for establishing a bonding path from said electrical device (32) and wherein said inner ends (34) of said second array of contact lead runs (77a–b) are bunched in groups (40) to establish spaces (41) between said groups (40) to provide at least one of said spaces (41) per said bonding target (39) aligned with said bonding path.

10. The device enclosure (30) of claim 9 further comprising another insulating layer (36d) overlying said second insulating layer (36c).

11. The device enclosure (30) of claim 8 wherein said first array of contact lead runs (75) have inner ends (33) adjacent said first region (31) of said substrate (83) and said second array of contact lead runs (77a–b) have inner ends (34) adjacent said inner ends (33) of said first array of contact lead runs (75), and wherein each of said inner ends (33) of said first array of contact lead runs (75) comprises a bonding target for establishing a bonding path from said electrical device (32) and wherein said inner ends (34) of said second array of contact lead runs (77a–b) are bunched in groups (40) to establish spaces between said groups (40) to provide at least one space (41) per bonding target (39) aligned with said bonding path.

12. The device enclosure (30) of claim 11 further comprising another insulating layer (36d) overlying said insulating layer (36c).

13. A device enclosure for containing a device with bonding pads, comprising:

$N_1$ lead runs arrayed on a first level, wherein said $N_1$ lead runs extend toward a central cavity adapted to contain said device, and wherein each of said $N_1$ lead runs terminates in a first bonding area adapted to receive a first connection from a corresponding one of said bonding pads on said device;

$N_2$ lead runs arrayed on a second level, different from said first level, wherein said $N_2$ lead runs extend toward said central cavity, and wherein each of said $N_2$ lead runs terminates in a second bonding area adapted to receive a second connection from a corresponding other of said bonding pads on said device; and wherein said second bonding areas are arranged in groups circumferentially positioned around said central cavity, wherein said groups are separated by $N_3$ spaces, wherein $N_3$ at least equals $N_1$, and wherein $N_1$ is not greater than 30% of $N_1 + N_2$.

14. A method for connecting electrical devices having multiple bonding pads to electrical device enclosures having more than one level of lead runs, comprising:

providing an electrical device enclosure having a device bonding region, a first array of $N_1$ lead runs surrounding said device bonding region, a second array of $N_2$ lead runs overlying said $N_1$ leads runs, wherein more than one of said $N_1$ lead runs comprises a bonding path indicator defining a preferred bonding path between each of said $N_1$ lead runs and an associated one of said bonding pads, and wherein said $N_2$ lead runs have end portions bunched into $N_3$ groups separated by $N_3$ spaces with said $N_3$ spaces aligned along said preferred bonding paths, wherein $N_3$ at least equals $N_1$;

providing an electrical device having multiple bonding pads arranged into two groups, a first group intended for connection to a first predetermined number of said first array of $N_1$ lead runs and a second group intended for connection to a second predetermined number of said second array of $N_2$ lead runs, wherein said second group is divided into at least $N_4$ subgroups where $N_4 = N_3$;

bonding first said electrical device onto said device bonding region oriented such that said first group of said bonding pads is oriented facing said $N_1$ lead runs, such that said $N_4$ subgroups are facing said $N_3$ groups, and such that no one of said $N_4$ subgroups has a larger number of bonding pads than the facing one of said $N_3$ groups;

choosing first a first of said $N_1$ lead runs and a first of said bonding pads facing said first of said $N_1$ lead runs;

bonding second a first connection means between said first of said bonding pads and said first of said $N_1$ lead runs along said preferred bonding path;

choosing second a first of said $N_2$ lead runs rotationally displaced from said preferred bonding path by a first angle and located on a first side of the one of said $N_3$ spaces aligned with said first of said $N_1$ lead runs;

choosing third a second of said bonding pads associated with said first of said $N_2$ lead runs and rotationally displaced from said preferred bonding path by substantially said first angle;

bonding third a second connection means between said second of said bonding pads and said first of said $N_2$ lead runs along a path rotationally displaced from said preferred bonding path by substantially said first angle;

before or after said second and third choosing steps, repeating first said first choosing and said second bonding steps until said first predetermined number of connections have been made to said first array of $N_1$ lead runs; and before or after completing said first repeating step, repeating second said second and third choosing steps and said third bonding steps until said second predetermined number of connections have been made to said second array of $N_2$ lead runs.

* * * * *